United States Patent
Nakamata et al.

(10) Patent No.: US 9,355,943 B2
(45) Date of Patent: May 31, 2016

(54) MANUFACTURING AND EVALUATION METHOD OF A SEMICONDUCTOR DEVICE

(71) Applicant: FUJI ELECTRIC CO., LTD., Kawasaki-shi (JP)

(72) Inventors: Yuko Nakamata, Matsumoto (JP); Yuji Ichimura, Matsumoto (JP); Kei Yamaguchi, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/154,788

(22) Filed: Jan. 14, 2014

(65) Prior Publication Data

US 2014/0210060 A1  Jul. 31, 2014

(30) Foreign Application Priority Data

Jan. 29, 2013  (JP) .................................. 2013-014516

(51) Int. Cl.
*H01L 21/00* (2006.01)
*H01L 23/495* (2006.01)
(Continued)

(52) U.S. Cl.
CPC ........ *H01L 23/49531* (2013.01); *H01L 23/296* (2013.01); *H01L 23/3121* (2013.01);
(Continued)

(58) Field of Classification Search
CPC ... H01L 24/49; H01L 23/296; H01L 23/3121; H01L 23/49531; H01L 23/4952; H01L 23/49586; H01L 21/56; H01L 23/31
USPC .......................................... 438/127; 257/666
See application file for complete search history.

(56) References Cited

U.S. PATENT DOCUMENTS

| 5,937,279 A | * | 8/1999 | Sawada ............... H01L 23/3142 257/E23.037 |
| 2006/0051894 A1 | * | 3/2006 | Liu et al. ....................... 438/108 |

(Continued)

FOREIGN PATENT DOCUMENTS

| JP | 09-124901 | * | 5/1997 | .............. C08L 63/00 |
| JP | 2002-069661 A | | 3/2002 | |

OTHER PUBLICATIONS

Yoshiaki Ito and Hidetaka Uno: "Study of the Trace Element State in Metal—Chemical State of Trace Element in Cu Side at Interface of Epoxy Resin and Cu Alloy-", Publisher: Fukushima Technology Centre; Place of Publication: Test and Research Report of Fukushima Technology Centre; Mar. 31, 1995, pp. 71-77.

(Continued)

*Primary Examiner* — Khiem D Nguyen
(74) *Attorney, Agent, or Firm* — Rabin & Berdo, P.C.

(57) ABSTRACT

Provided is a method of manufacturing a semiconductor device which includes a semiconductor chip, an insulating board mounted with the semiconductor chip and having a wiring pattern, and a leadframe connected to the wiring pattern, the semiconductor chip, the wiring pattern and the leadframe being partially sealed with a sealing resin, wherein: an epoxy resin composition formed by adding 0.3 to 0.7 mass % of epoxysilane as a silane coupling agent to an epoxy resin is used as the sealing resin; and a copper member made of copper or a copper alloy and having an oxide film formed in the surface with a film thickness in a color indicated by an L* value in the range of 48 to 51, an a* value in the range of 40 to 49 and a b* value in the range of 24 to 40 is used as the leadframe and the wiring pattern.

3 Claims, 6 Drawing Sheets

(51) Int. Cl.
*H01L 23/00* (2006.01)
*H01L 23/29* (2006.01)
*H01L 23/31* (2006.01)

(52) U.S. Cl.
CPC ...... *H01L 23/4952* (2013.01); *H01L 23/49586* (2013.01); *H01L 24/49* (2013.01); *H01L 2224/48137* (2013.01); *H01L 2224/48139* (2013.01); *H01L 2224/4903* (2013.01); *H01L 2924/00014* (2013.01); *H01L 2924/1305* (2013.01); *H01L 2924/13055* (2013.01); *H01L 2924/15787* (2013.01); *H01L 2924/181* (2013.01)

(56) References Cited

U.S. PATENT DOCUMENTS

| | | | |
|---|---|---|---|
| 2010/0177326 A1* | 7/2010 | Sakai | G01B 11/06 356/632 |
| 2012/0126380 A1* | 5/2012 | Uenda et al. | 257/659 |

OTHER PUBLICATIONS

"Study of the Trace Element State in Metal", pp. 71-77.
Nomura et al. "Adhesion Characteristic of Copper Alloys to Mold Resin as a IC Leadframe", Kobe Steel Engineering Reports, vol. 48, No. 3, pp. 21-24, Dec. 1998.

* cited by examiner

MANUFACTURING AND EVALUATION METHOD OF A SEMICONDUCTOR DEVICE

CROSS REFERENCE TO RELATED APPLICATION

The entire disclosure of the inventor's corresponding Japanese patent application, Serial No. JP PA 2013-014516, filed Jan. 29, 2013, is hereby incorporated by reference.

BACKGROUND OF THE INVENTION

1. Field of the Invention

The present invention relates to improvement of the adhesion between a copper-based material and a sealing resin which are used in a semiconductor device.

2. Description of the Background Art

High adhesion to a copper-based leadframe or wiring pattern may be used for a sealing resin used in a semiconductor device, in order to establish compatibility between a recent request on the semiconductor device for high reliability against humidity, heating/cooling cycles, vibration, etc. and a recent request on the semiconductor device for cost reduction.

In the background art, there has been known and used a technique in which a silane coupling agent is mixed into an epoxy-based sealing resin by an integral blending method (internal addition to the resin) in order to improve the adhesion between the sealing resin and the copper-based leadframe or wiring pattern.

In addition, in order to ensure stable adhesion between a copper-based material and a sealing resin, an oxide film may be present in the surface of the copper-based material (see Technical Reports of Fukushima Technology Center Research P. 71-77 1992 and Koya Nomura and Hiroshi Sakamoto, "Adhesion Characteristics of Copper Alloys to Mold Resin as a IC Leadframe", Kobe Steel Engineering Reports, Vol. 48, No. 3, December 1998, p. 21-24). On the other hand, since the copper surface is apt to be oxidized, the surface is normally treated with an antioxidant in order to prevent an adverse effect on the adhesive force or to aggressively improve the adhesion.

Figure 5:
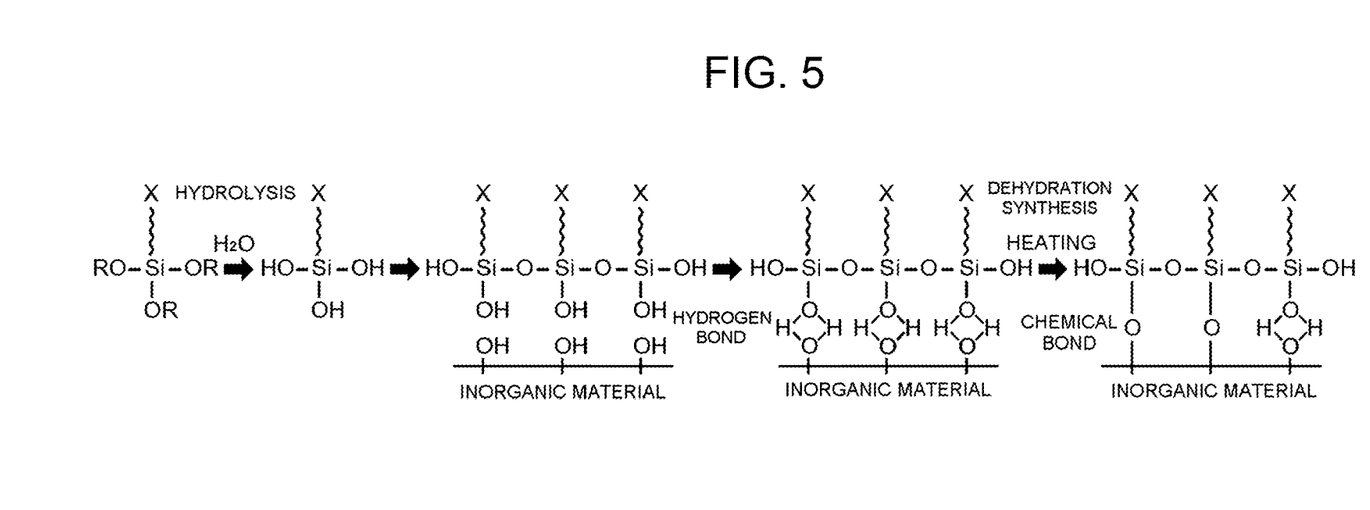
FIG. 5 is an explanatory view showing a reaction mechanism of the silane coupling agent.

The silane coupling agent exhibits a reaction mechanism as shown in FIG. 5, and has a hydrolyzable group having affinity or reactivity to an inorganic material such as the copper-based leadframe and an organic functional group making a chemical bond to an organic synthetic resin etc. in a molecule. Accordingly, mechanical strength, water resistance, adhesion, etc. in an interface between a composite material (such as blending of a silica filler into an epoxy resin) and the copper-based leadframe can be improved by a function of bonding the organic material and the inorganic material to each other. The proper quantity of usage of the silane coupling agent on that occasion can be obtained by empirical examinations.

For example, in JP-A-9-124901, a semiconductor sealing epoxy resin composition which contains a predetermined crystalline epoxy resin, a flexible curing agent, a curing accelerator, an inorganic filler, an unsaturated double bond-containing silane coupling agent, and a mold release agent as essential components has been disclosed as a technique relating to a semiconductor sealing resin.

When a relatively large amount of a silane coupling agent is blended into an epoxy resin, there is a problem that some of the silane coupling agent stays unreacted in the resin to cause hydrolysis of the epoxy resin to thereby lower the adhesive force, the elastic modulus and Tg of the epoxy resin. Accordingly, it is necessary to obtain the blending quantity of the silane coupling agent by empirical examinations.

In addition, when the copper-based leadframe or wiring pattern is used, the adhesion high enough to satisfy the high reliability request cannot be ensured simply by addition of an optimal quantity of the silane coupling agent. Further, as described above, an oxide film may be present in the copper surface in order to ensure stable adhesion between the copper-based leadframe or wiring pattern and the sealing resin. However, the relation between the kind of copper (an additive etc.) or the composition or film thickness of the oxide film and the adhesive force to the epoxy resin has not been made clear yet. Further, when the copper-based leadframe or wiring pattern is treated with an antioxidant, there is a drawback that the resin will be decomposed in the adhesive interface in a moisture-resistance and heat-resistance test.

SUMMARY OF THE INVENTION

Therefore, to solve the foregoing problems, an object of the invention is to provide a method of manufacturing a semiconductor device and the semiconductor device, in which satisfactory adhesion between a copper surface and an epoxy resin can be achieved without causing any problem due to excessive blending of a silane coupling agent so that high reliability can be ensured even in a high temperature and high humidity environment. In addition, another object of the invention is to provide a bonding surface strength evaluating method which is useful for manufacturing such a semiconductor device.

As a result of keen examinations on the relation between conditions for forming an oxide film in the surface of a copper-based material and the adhesion between the copper-based material and an epoxy resin, the present inventors have accomplished the invention by finding out that the foregoing problems can be solved by optimizing the kind and the blending quantity of a silane coupling agent blended into the epoxy resin and defining the film thickness of the oxide film in the surface of the copper-based material within a predetermined range.

That is, the method of manufacturing a semiconductor device according to the invention is a method of manufacturing a semiconductor device which includes a semiconductor chip, an insulating board mounted with the semiconductor chip and having a wiring pattern, and a leadframe connected to the wiring pattern, the semiconductor chip, the wiring pattern and the leadframe being partially sealed with a sealing resin, wherein: an epoxy resin composition formed by adding an 0.3 to 0.7 mass % of epoxysilane as a silane coupling agent to an epoxy resin is used as the sealing resin; and a copper member made of copper or a copper alloy and having an oxide film formed in the surface with a film thickness in a color indicated by an L* value in the range of 48 to 51, an a* value in the range of 40 to 49 and a b* value in the range of 24 to 40 is used as the leadframe and the wiring pattern.

In addition, the semiconductor device according to the invention is a semiconductor device including a semiconductor chip, an insulating board mounted with the semiconductor chip and having a wiring pattern, and a leadframe connected to the wiring pattern, the semiconductor chip, the wiring pattern and the leadframe being partially sealed with a sealing resin, wherein: the sealing resin consists of an epoxy resin composition formed by adding 0.3 to 0.7 mass % of epoxysilane as a silane coupling agent to an epoxy resin; and the leadframe and the wiring pattern are made of copper or a copper alloy and an oxide film 20 nm to 40 nm thick is formed in the surfaces of the leadframe and the wiring pattern which are in contact with the sealing resin.

Further, the method of evaluating strength of a bonding surface according to the invention is a method of evaluating strength of a bonding surface between the surface of an oxide film and a cured product of a resin formed on the surface of the oxide film in a molded article formed by integrating the resin with a copper member by insert molding, the copper member being made of copper or a copper alloy and having the oxide film in the surface, wherein: the film thickness of the oxide film is evaluated by an L* value, an a* value and a b* value of the surface of the oxide film.

In the method of evaluating strength of a bonding surface according to the invention, an epoxy resin composition may be used as the resin.

According to the invention, with the aforementioned configuration, it is possible to achieve a method of manufacturing a semiconductor device and the semiconductor device, in which satisfactory adhesion between a copper surface and an epoxy resin can be achieved and high reliability can be ensured even in a high temperature and high humidity environment. In addition, according to the invention, it is also possible to achieve a bonding surface strength evaluating method useful for manufacturing such a semiconductor device.

DETAILED DESCRIPTION OF THE INVENTION

An embodiment of the invention will be described below in detail.

Figure 1:
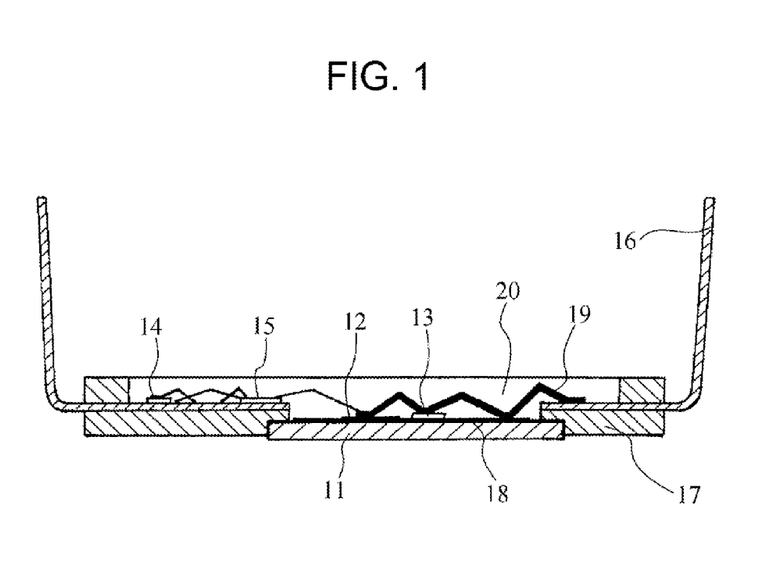
FIG. 1 is a sectional view showing an example of a semiconductor device according to the invention.

FIG. 1 is a sectional view showing an example of a semiconductor device according to the invention. In an intelligent power module (IPM) shown in FIG. 1, an IGBT (Insulated Gate Bipolar Transistor) chip and a drive circuit are integrated, so that a three-phase inverter bridge circuit which includes a low loss IGBT chip 12 forming an inverter circuit and a high speed FWD (Free Wheeling Diode) chip 13 is bonded and mounted on an insulating board 11 by soldering etc. In addition, a leadframe 16 mounted with a BSD (Boot-Strap-Diode) 14 and an IC 15 driving the three-phase inverter bridge circuit is integrated with a casing 17, connected to a wiring pattern 18 on the insulating board 11 through a bonding wire 19 and sealed with a sealing resin 20.

The following points are important in the invention. That is, an epoxy resin composition formed by adding 0.3 to 0.7 mass % of epoxysilane as a silane coupling agent to an epoxy resin is used as the sealing resin 20, and a copper member made of copper or a copper alloy and having an oxide film with a predetermined film thickness is used as the leadframe 16 and the wiring pattern 18. When the material of the sealing resin 20 and the material of the leadframe 16 and the wiring pattern 18 are set as such a configuration combination, it is possible to obtain a semiconductor device in which satisfactory adhesion between the epoxy resin forming the sealing resin 20 and the copper surface in the leadframe 16 and the wiring pattern 18 can be ensured and high reliability can be attained even in a high temperature and high humidity environment. Moreover, in the invention, degradation of the sealing resin caused by excessive blending of the silane coupling agent can be prevented.

Figure 2:
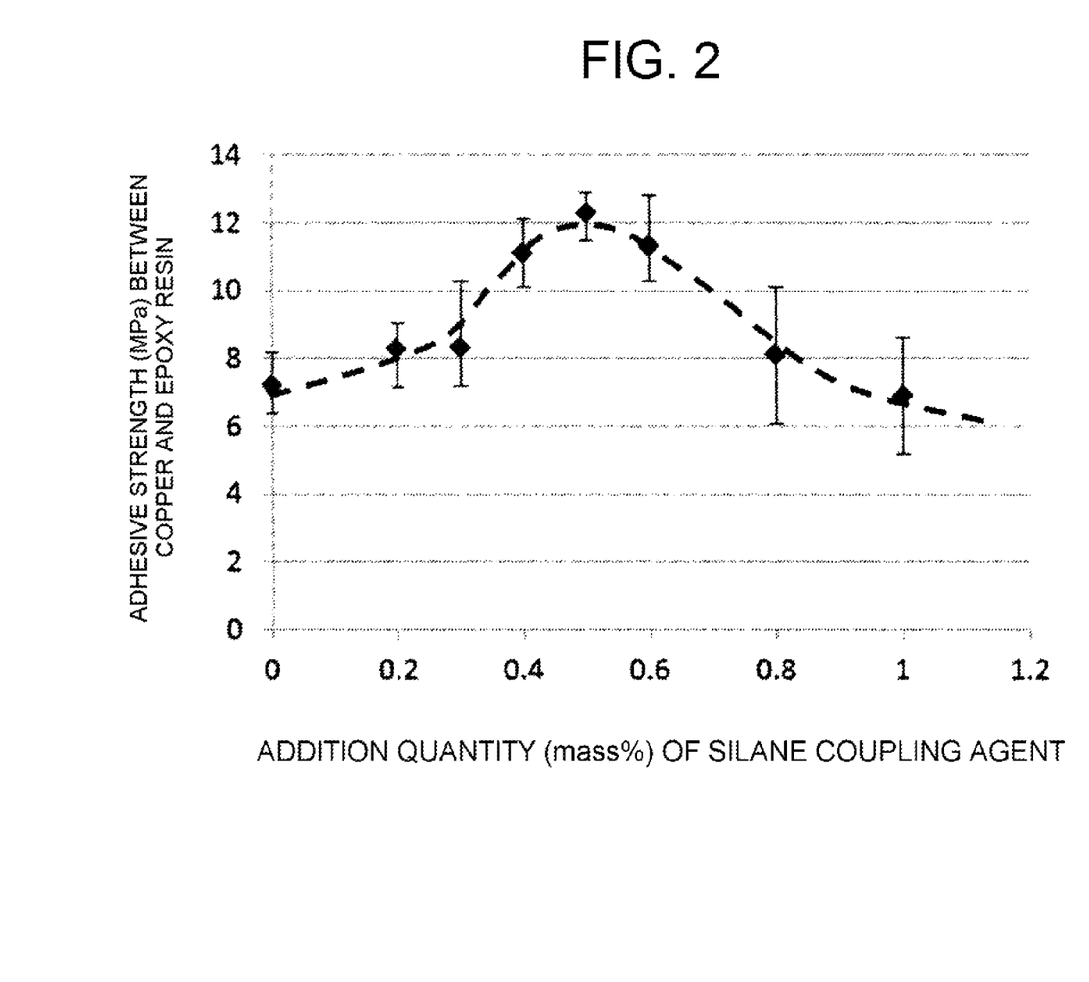
FIG. 2 is a graph showing an example of a measurement result of an addition quantity of a silane coupling agent and adhesive strength between a resin and copper circuit foil.

The sealing resin 20 used in the invention contains an epoxy resin as a main component, to which 0.3 to 0.7 mass %, preferably 0.4 to 0.6 mass % of epoxysilane is added as a silane coupling agent. FIG. 2 shows a graph showing a measurement result of an addition quantity of the silane coupling agent to the epoxy resin and adhesive strength between the sealing resin and copper circuit foil having a 7 nm-thick oxide film in the surface. As shown in FIG. 2, it can be recognized that the adhesive strength reaches a peak value when the addition quantity of the silane coupling agent is 0.5 mass %, and the adhesive strength tends to decrease when the addition quantity is further increased. That is, when the blending quantity of the silane coupling agent is too small, satisfactory adhesion cannot be obtained. When the blending quantity of the silane coupling agent is too large, failure such as hydrolysis of the epoxy resin occurs. This can be conceived that an excess of the silane coupling agent which does not form a hydrogen bond to the copper surface is generated due to excessive addition of the silane coupling agent so that an OH group produced by hydrolysis of the excessive silane coupling agent decomposes the epoxy resin to thereby degrade the resin.

The epoxy resin is not particularly limited. For example, bisphenol A type epoxy resin, bisphenol F type epoxy resin, bisphenol S type epoxy resin, phenol novolac type epoxy resin, cresol novolac type epoxy resin, glycidyl ester type epoxy resin, glycidyl amine type epoxy resin, etc. may be used as the epoxy resin. In addition, for example, 3-glycidoxypropyltrimethoxysilane, 3-glycidoxypropyltriethoxysilane, 3-glycidoxypropylmethyldimethoxysilane, 3-glycidoxypropylmethyldiethoxysilane, 2-(3,4-epoxycyclohexyl)ethyltrimethoxysilane, etc. may be used as the epoxysilane. A single kind of these or a mixture of two or more kinds of them may be used.

It is preferable that an acid anhydride curing agent is further contained as a curing agent in the sealing resin 20 used in the invention. Aromatic acid anhydride such as phthalic acid anhydride, pyromellitic acid anhydride and trimellitic acid anhydride; cyclic aliphatic acid anhydride such as tetrahydrophthalic acid anhydride, methyl tetrahydrophthalic acid anhydride, methyl nadic acid anhydride, hexahydrophthalic acid anhydride and methyl hexahydrophthalic acid anhydride; aliphatic acid anhydride such as succinic acid anhydride, poly adipic acid anhydride, poly sebasic acid anhydride, and poly azelaic acid anhydride; etc. may be used as the acid anhydride curing agent. In addition, tertiary amine, boric acid ester, Lewis acid, an organometallic compound, organic acid metal salt, imidazole etc. may be blended as a curing accelerator in the sealing resin 20 used in the invention. Further, one kind or two or more kinds selected from the group consisting of silica, alumina, aluminum hydroxide, talc, clay, mica, glass fiber, etc. may be blended in combination in the sealing resin 20 used in the invention.

In the invention, the silane coupling agent is added to the epoxy resin preferably by integral blending, i.e., the silane coupling agent is added directly at the time of mixing the resin and an inorganic filler with each other, in view of working efficiency and reduction in the variation of the quality.

In the invention, the leadframe 16 and the wiring pattern 18 are made of copper or a copper alloy in which an oxide film 20 nm to 40 nm thick, preferable 20 nm to 30 nm thick is formed. As described above, an oxide film may be present in the copper surface in order to ensure stable adhesion between a copper product made of such a copper-based metal and the sealing resin. It has been made clear by the examinations of the inventors that high adhesive strength can be ensured when the film thickness of the oxide film is set in the aforementioned range. Such an oxide film can be formed with a desirable film thickness, for example, by heating electrolytic copper foil in the air. For example, products made by Fukuta Metal Foil & Powder Co., Ltd., Furukawa Electric Co, Ltd., etc. may be used as the electrolytic copper foil. In the invention, an expected effect can be obtained when the oxide film is formed in the surfaces of the leadframe 16 and the wiring pattern 18 which are in contact with the sealing resin.

In the semiconductor device according to the invention, any materials may be used as the material of the leadframe 16 and the wiring pattern 18 and the material of the sealing resin 20, as long as the materials satisfy the aforementioned conditions. Details of the specific device configuration, materials of other constituent members, etc. are not limited particularly but may be selected suitably and used from those ordinarily used in the field. For example, a ceramic board in which a ceramic plate is used as an insulator, a printed wiring board in which an insulating resin is used as an insulator, etc. may be used as the insulating board 11.

Figure 3:
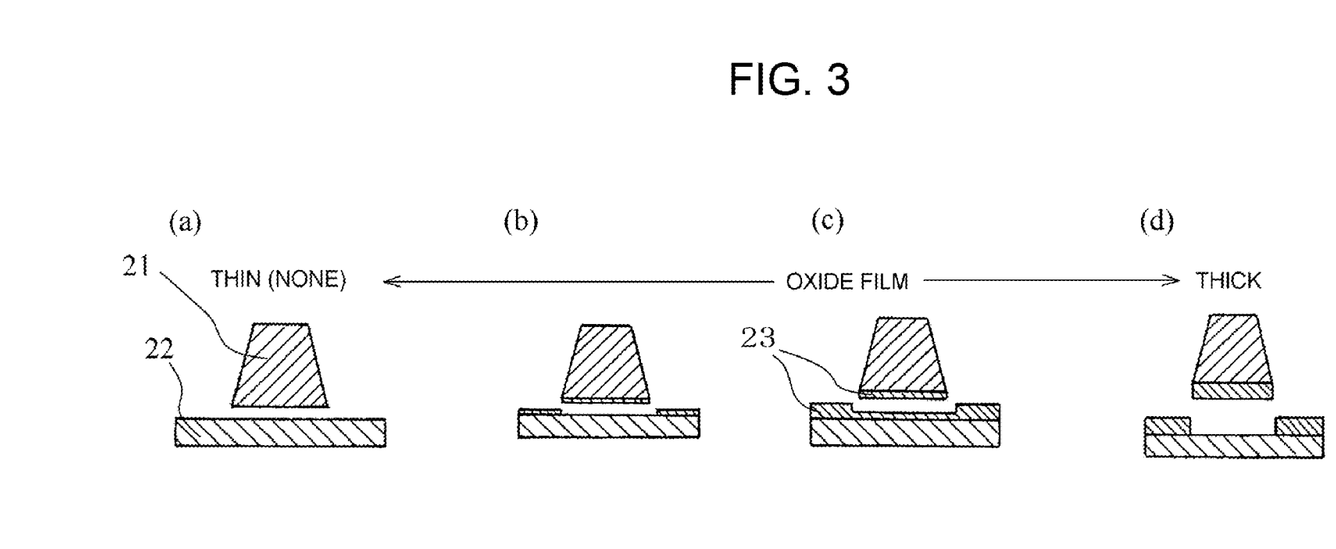
FIG. 3 is an explanatory view showing the relation between the film thickness of an oxide film formed in the surface of a copper product and a fracture state.

The adhesive force between the sealing resin such as an epoxy resin and the copper member has close relation with mechanical properties of copper oxide such as hardness, strength, roughness, etc., the adhesive force between the oxide film and the resin, and the adhesive force between the oxide film and the copper surface. It is conceived that the adhesive force between the sealing resin and the copper member depends on the balance of these factors. Since the copper oxide has a nano-order film thickness, the mechanical properties of the copper oxide have not been made clear yet. According to the examinations of the inventors, a fracture state of a bonding surface between a resin 21 and a copper product 22 varies depending on the film thickness of an oxide film 23 formed on the surface of the copper product, as shown in FIG. 3. In the case (a) where the film thickness is zero, the fracture state is delamination fracture in an interface between the resin 21 and the copper product 22. In the case (b) where the film thickness is too thin and the case (d) where the film thickness is too large, the fracture state is delamination fracture in an interface between the copper product 22 and the oxide film 23. In the case (c) where the film thickness is 20 nm to 40 nm, which is a proper range according to the invention, the fracture state is base material fracture of the oxide film. From the examinations of the inventors, it has been proved that the conditions indicating the maximum fracture strength in a test for measuring adhesive strength of the bonding surface are that the oxide film is dense and exhibits a high strength state and the fracture state is the base material fracture of the oxide film.

Here, the film thickness of the oxide film formed on the surface of the copper product can be quantified, for example, by use of XPS (X-Ray Photoelectron Spectroscopy)/ESCA (Electron Spectroscopy for Chemical Analysis) (hereinafter abbreviated to ESCA). Measurement using the ESCA is not easy. For example, the thickness of the residual oxide film staying behind on the fracture surface after adhesion fracture can be hardly quantified by ESCA because the film thickness is further thin. Therefore, in the invention, the film thickness of the oxide film is quantified based on an L* value, an a* value and a b* value of the surface of the oxide film measured by a color difference meter so that strength of the bonding surface can be evaluated. These values can be used as indices for evaluating the strength of the bonding surface between the surface of the oxide film and a cured product of the resin formed on the surface of the oxide film in a molded article formed by integrating the resin with the copper member having the oxide film in the surface by insert molding. The color difference meter exhibits color difference by chromatic values. The L* value, the a* value and the b* value are chromatic values based on an L*a*b* color system (see "JIS Z 8729"). Accordingly, when color difference is obtained by use of the chromatic values of the surface of the oxide film before bonding, the film thickness of the oxide film can be quantified. Incidentally, absolute values in proper ranges of the L* value, the a* value and the b* value vary depending on the composition of the copper raw material, etc.

In the invention, the aforementioned method of evaluating the strength of the bonding surface is used so that whether the formation state of the oxide film in the copper member is in a proper range or not in order to ensure satisfactory adhesion to the resin can be checked before a fracture test between the surface of the oxide film and the cured product of the resin is performed. Accordingly, when the method of evaluating the strength of the bonding surface is used at the time of manufacturing a semiconductor device according to the invention, a semiconductor device with high reliability can be obtained.

That is, in the invention, a semiconductor device may be manufactured when an epoxy resin composition formed by adding 0.3 to 0.7 mass % of epoxysilane to an epoxy resin is used as the sealing resin used in the semiconductor device according to the invention, and a copper member made of copper or a copper alloy and having an oxide film in the surface to have a film thickness in a color indicated by the L* value in the range of 48 to 51, the a* value in the range of 40 to 49 and the b* value in the range of 24 to 40 is used as the leadframe and the wiring pattern. In addition, in the manufacturing process, a step of measuring the color as to the leadframe and the wiring pattern may be added. As to the oxide film, a verification test may be performed for verifying that the oxide film has a film thickness in a color indicated by the L* value in the range of 48 to 51, the a* value in the range of 40 to 49 and the b* value in the range of 24 to 40.

Incidentally, the test for measuring the adhesive strength between the cured product of the resin and the surface of the oxide film may be performed by a so-called pudding test, which is a method of applying a load in parallel with the surface of the oxide film.

EXAMPLES

The invention will be described below specifically along with Examples.

Example 1

An epoxy resin composition was prepared by adding 0.3 mass % of epoxysilane (made by Shin-Etsu Chemical Co., Ltd., KBM403) as a silane coupling agent to a bisphenol A type epoxy resin (made by Pelnox, Ltd., ME-268D, containing 70 mass % of fused silica particles). A small capacity air-conditioner IPM having a sectional structure shown in FIG. 1 was produced by use of this epoxy resin composition as a sealing resin. A leadframe and a wiring pattern of this IPM were made of a copper-based material having a 30 nm-thick oxide film formed in the surface.

Example 2

A small capacity air-conditioner IPM was produced in the same manner as in Example 1 except that the concentration of epoxysilane added to the epoxy resin was 0.5 mass % and a copper-based material having a 33 nm-thick oxide film formed in the surface was used for the leadframe and the wiring pattern.

Example 3

A small capacity air-conditioner IPM was produced in the same manner as in Example 1 except that the concentration of epoxysilane added to the epoxy resin was 0.5 mass % and a copper-based material having a 20 nm-thick oxide film formed in the surface was used for the leadframe and the wiring pattern.

Example 4

A small capacity air-conditioner IPM was produced in the same manner as in Example 1 except that the concentration of epoxysilane added to the epoxy resin was 0.7 mass % and a copper-based material having a 31 nm-thick oxide film formed in the surface was used for the leadframe and the wiring pattern.

Example 5

A small capacity air-conditioner IPM was produced in the same manner as in Example 1 except that the concentration of epoxysilane added to the epoxy resin was 0.7 mass % and a copper-based material having a 35 nm-thick oxide film formed in the surface was used for the leadframe and the wiring pattern.

Example 6

A small capacity air-conditioner IPM was produced in the same manner as in Example 1 except that the concentration of epoxysilane added to the epoxy resin was 0.7 mass % and a copper-based material having a 20 nm-thick oxide film formed in the surface was used for the leadframe and the wiring pattern.

Comparative Example 1

A small capacity air-conditioner IPM was produced in the same manner as in Example 1 except that the concentration of epoxysilane added to the epoxy resin was 0.5 mass % and a copper-based material having a 10 nm-thick oxide film formed in the surface was used for the leadframe and the wiring pattern.

Comparative Example 2

A small capacity air-conditioner IPM was produced in the same manner as in Example 1 except that the concentration of epoxysilane added to the epoxy resin was 0.5 mass % and a copper-based material having a 50 nm-thick oxide film formed in the surface was used for the leadframe and the wiring pattern.

[Quantification of Film Thickness of Copper Oxide Film]

The film thickness of the copper oxide film in the IPM in each Example etc. was quantified by use of an ESCA instrument Quantera SXM made by ULVAC-PHI, INCORPORATED. While etching in every depth of about 3 nm from the surface of the sample, analysis was continued until the peak of oxygen ceased to exist. The film thickness of the oxide film was obtained as a relative comparative value calculated using an etching rate of copper ($SiO_2$ equivalent) on the assumption that the point where the detected change quantity of oxygen became ½ was an interface between the oxide film and Cu.

[Measurement of Adhesive Strength]

Figure 4:
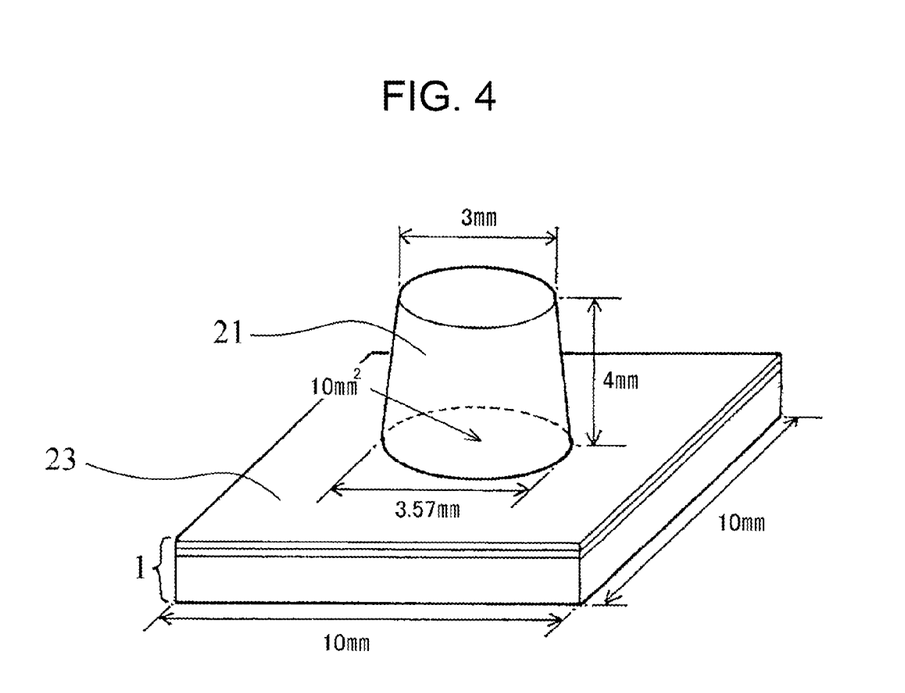
FIG. 4 is a perspective view showing a test piece for measurement of the adhesive strength.

As shown in FIG. 4, an epoxy resin composition used in each Example etc. was used to form a cured product on the surface of the oxide film of the copper-based material used in each Example etc., so that an adhesive strength measurement test piece was produced. Specifically, an insulating board was cut into a square shape measuring 10 mm by 10 mm, and a mold made of fluororesin was fixed on copper circuit foil in the surface of the insulating circuit. The epoxy resin composition was poured into the mold and heated for one hour in a thermostat chamber at 170° C. Thus, a cured product having an adhesive area of 10 $mm^2$ ($\phi$3.57 mm), an upper surface of $\phi$3 mm and a height of 4 mm was formed on the copper circuit foil. This cured product was pushed at a shear velocity of 1 mm/sec in parallel with the copper circuit foil surface so that the maximum fracture load at the time of fracture in the adhesive surface was measured. Each test was performed with n=5 so that a load measurement value per unit adhesive area was set as adhesive strength (adhesive force). The result of measurement is also shown in the following tables. This adhesive strength measurement test is to test bonding strength between a metal surface of a metal member and a resin which are integrated by insert molding. The test is commonly called a pudding test.

[Measurement of Color of Oxide Film Forming Surface of Copper]

Figure 6:
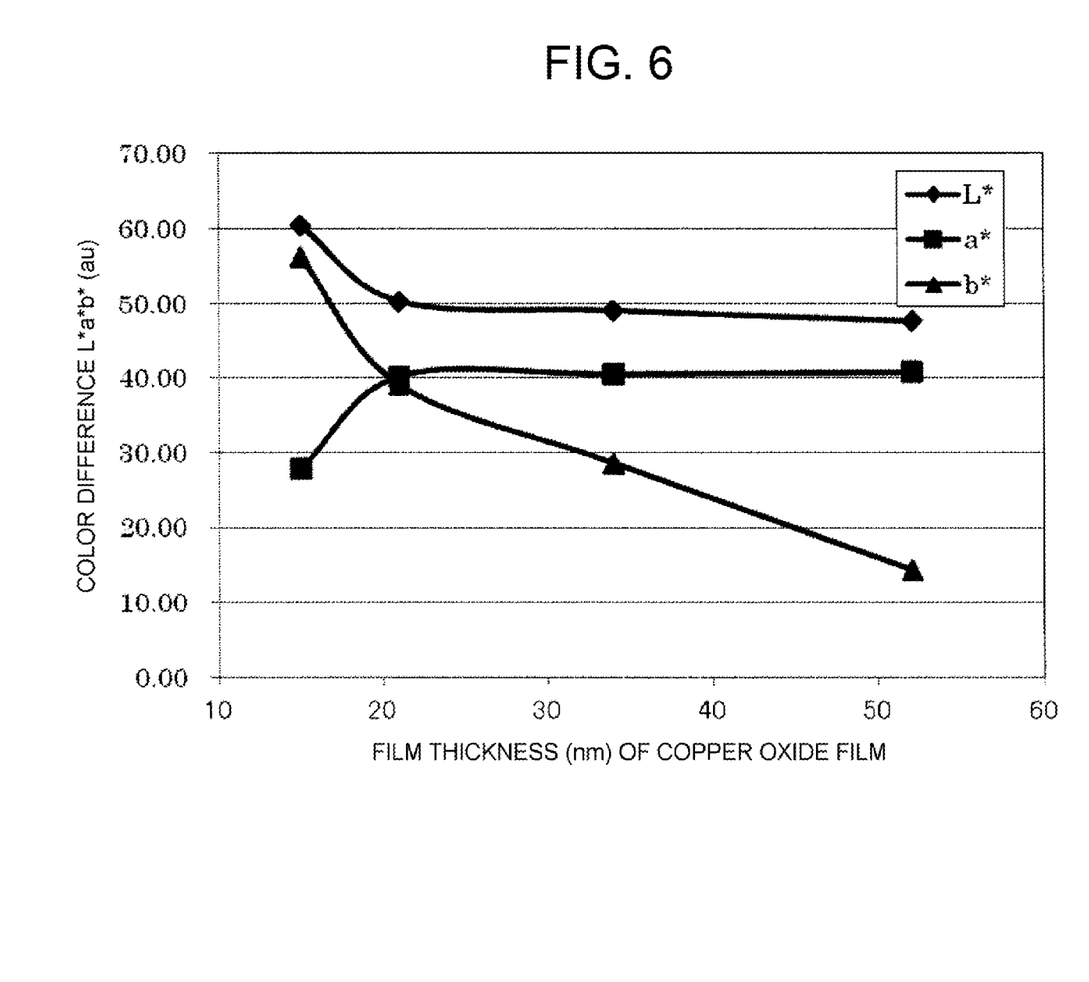
FIG. 6 is a graph showing the relation between L* value, a* value and b* value and the thickness of an oxide film in the surface of a copper member.

The surface of the oxide film of the copper-based material used in each Example etc. was measured by a color difference meter CR-400 (made by Konica Minolta Inc.) so that an L* value, an a* value and a b* value were obtained. The result of measurement is also shown in the following tables. Incidentally, the thickness of the oxide film of the copper-based material corresponding to the L* value, the a* value and the b* value was measured by use of ESCA, as described above. The relation between the measured L* value, a* value and b* value and the film thickness of the oxide film of the copper-based material was tabulated, as shown in FIG. 6. When such a relation between the L*value, the a* value and the b* value and the thickness of the oxide film is used, the thickness of the oxide film can be measured by a color difference meter. There is a merit that measurement of the L* value, the a* value and the b* value by a color difference meter can be performed more inexpensively and more easily than a method that is expensive and involves handling skill, such as measurement by ESCA.

[Reliability Test]

A reliability test for the IPM in each Example etc. was performed in test conditions 85° C./85% RH, Vce=480V based on a temperature humidity bias test (THB). When the endurance time is not shorter than 1,000 hours, it can be said that the IPM has sufficient reliability. The result of the reliability test is also shown in the following tables.

Incidentally, the copper-based materials used in the aforementioned Examples and Comparative Examples are printed wiring board copper foils defined in "JIS C 6515".

TABLE 1

|  |  | Example 1 | Example 2 | Example 3 | Example 4 |
|---|---|---|---|---|---|
| Addition Quantity (mass %) of Epoxysilane |  | 0.3 | 0.5 | 0.5 | 0.7 |
| Film Thickness (nm) of Oxide Film |  | 30 | 33 | 20 | 31 |
| Values of Copper Oxide | L*value | 49.6 | 49.3 | 50.5 | 49.5 |
| Film Surface in L*a*b* | a* value | 40.3 | 40.4 | 40.1 | 40.3 |
| Color System | b* value | 32.0 | 29.6 | 40.0 | 31.2 |
| Adhesive Force (MPa) |  | 18 | 22 | 25 | 20 |
| THB (Time) |  | >1000 | >1000 | >1000 | >1000 |

TABLE 2

|  |  | Example 5 | Example 6 | Comparative Example 1 | Comparative Example 2 |
|---|---|---|---|---|---|
| Addition Quantity (mass %) of Epoxysilane |  | 0.7 | 0.7 | 0.5 | 0.5 |
| Film Thickness (nm) of Oxide Film |  | 35 | 20 | 10 | 50 |
| Values of Copper Oxide | L*value | 49.2 | 50.5 | 75.1 | 47.8 |
| Film Surface in L*a*b* | a* value | 40.4 | 40.1 | 14.6 | 38.2 |
| Color System | b* value | 28.0 | 40.0 | 22.5 | 47.8 |
| Adhesive Force (MPa) |  | 17 | 23 | 13 | 11 |
| THB (Time) |  | >1000 | >1000 | <1000 | <1000 |

As shown in the aforementioned tables, excellent adhesive force can be obtained in the IPM in each Example satisfying the conditions concerned with the sealing resin and the copper-based material. It has been confirmed that 3,000 hours exceeding 1,000 hours as the appropriate performance could be achieved in the temperature humidity bias (THB) test. In addition, the IPM in each Example could establish reliability which could satisfy relevant specifications also in a test about heat resistance, heating/cooling cycles and steam pressurization.

What is claimed is:

1. A method for manufacturing a semiconductor device, comprising:
    providing a semiconductor chip, an insulating board mounted with the semiconductor chip and having a wiring pattern, and a leadframe connected to the wiring pattern; and
    partially sealing the semiconductor chip, the wiring pattern, and the leadframe with a sealing resin;
    wherein an epoxy resin composition formed by adding 0.3 to 0.7 mass % of epoxysilane as a silane coupling agent to an epoxy resin is used as the sealing resin; and
    wherein a copper member including copper or a copper alloy and having an oxide film formed with a film thickness in a color indicated by an L* value in the range of 48 to 51, an a* value in the range of 40 to 49, and a b* value in the range of 24 to 40 is used as the leadframe and the wiring pattern,
    wherein the L* value, the a* value, and the b* value are chromatic values of a predetermined color system.

2. The method for manufacturing a semiconductor device according to claim 1, further comprising determining a strength of a bonding surface of the oxide film based upon the film thickness of the oxide film by evaluating the L* value, the a* value, and the b* value of the surface of the oxide film.

3. The method for manufacturing a semiconductor device according to claim 2, wherein the color system is JIS Z 8729 color system.

* * * * *